United States Patent
Chen

(10) Patent No.: US 8,787,105 B2
(45) Date of Patent: Jul. 22, 2014

(54) DYNAMIC RANDOM ACCESS MEMORY WITH MULTIPLE THERMAL SENSORS DISPOSED THEREIN AND CONTROL METHOD THEREOF

(75) Inventor: Chih-Jen Chen, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 317 days.

(21) Appl. No.: 13/468,987

(22) Filed: May 10, 2012

(65) Prior Publication Data

US 2013/0301371 A1 Nov. 14, 2013

(51) Int. Cl.
*G11C 7/00* (2006.01)

(52) U.S. Cl.
USPC .......................................... 365/222; 365/211

(58) Field of Classification Search
CPC ... G11C 11/406; G11C 11/40626; G11C 7/04

USPC .................................................. 365/222, 211
See application file for complete search history.

(56) References Cited

U.S. PATENT DOCUMENTS

| | | | |
|---|---|---|---|
| 7,403,440 B2 * | 7/2008 | Perner | 365/222 |
| 2006/0280012 A1 * | 12/2006 | Perner | 365/222 |
| 2010/0195412 A1 * | 8/2010 | Furutani et al. | 365/211 |
| 2013/0242674 A1 * | 9/2013 | Furutani et al. | 365/222 |

* cited by examiner

*Primary Examiner* — Tuan T Nguyen

(57) ABSTRACT

A dynamic random access memory (DRAM) with multiple thermal sensors disposed therein and a control method for the DRAM. A DRAM in accordance with an exemplary embodiment of the invention provides multi-zone temperature detection. The DRAM comprises a plurality of banks, a plurality of thermal sensors and a control unit. The thermal sensors are disposed between the banks. The control unit controls the thermal sensors to obtain sensed temperatures, and sets a self-refresh cycle for all of the banks based on the highest one of the sensed temperatures.

15 Claims, 4 Drawing Sheets

DYNAMIC RANDOM ACCESS MEMORY WITH MULTIPLE THERMAL SENSORS DISPOSED THEREIN AND CONTROL METHOD THEREOF

BACKGROUND OF THE INVENTION

1. Field of the Invention

The present invention relates to dynamic ransom access memories (DRAMs), and in particular relates to data retention of the DRAM.

2. Description of the Related Art

With the shrinking of the device size, a DRAM controller may be superposed over or overlapped by a storage array of the DRAM. The heat from the DRAM controller may considerably increase the temperature of the storage cells. The increasing temperature of the storage cells may result in current leakage, so that the data stored in the storage cells under/over the DRAM controller may be damaged.

BRIEF SUMMARY OF THE INVENTION

A dynamic random access memory (DRAM) and a control method for the DRAM are disclosed.

A DRAM in accordance with an exemplary embodiment of the invention provides multi-zone temperature detection. The DRAM comprises a plurality of banks, a plurality of thermal sensors and a control unit. The thermal sensors are disposed between the banks. The control unit controls the thermal sensors to obtain sensed temperatures, and sets a self-refresh cycle for all of the banks based on the highest one of the sensed temperatures.

In another exemplary embodiment, a DRAM control method is shown, wherein the DRAM comprises a plurality of thermal sensors disposed between banks of the DRAM. According to the disclosed DRAM control method, the thermal sensors are controlled to obtain sensed temperatures, and, a self-refresh cycle for all of the banks is set based on the highest one of the sensed temperatures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the several exemplary embodiments carrying out the invention. This description is made for the purpose of illustrating the general principles of the invention and should not be taken in a limiting sense. The scope of the invention is best determined by reference to the appended claims.

Figure 1:
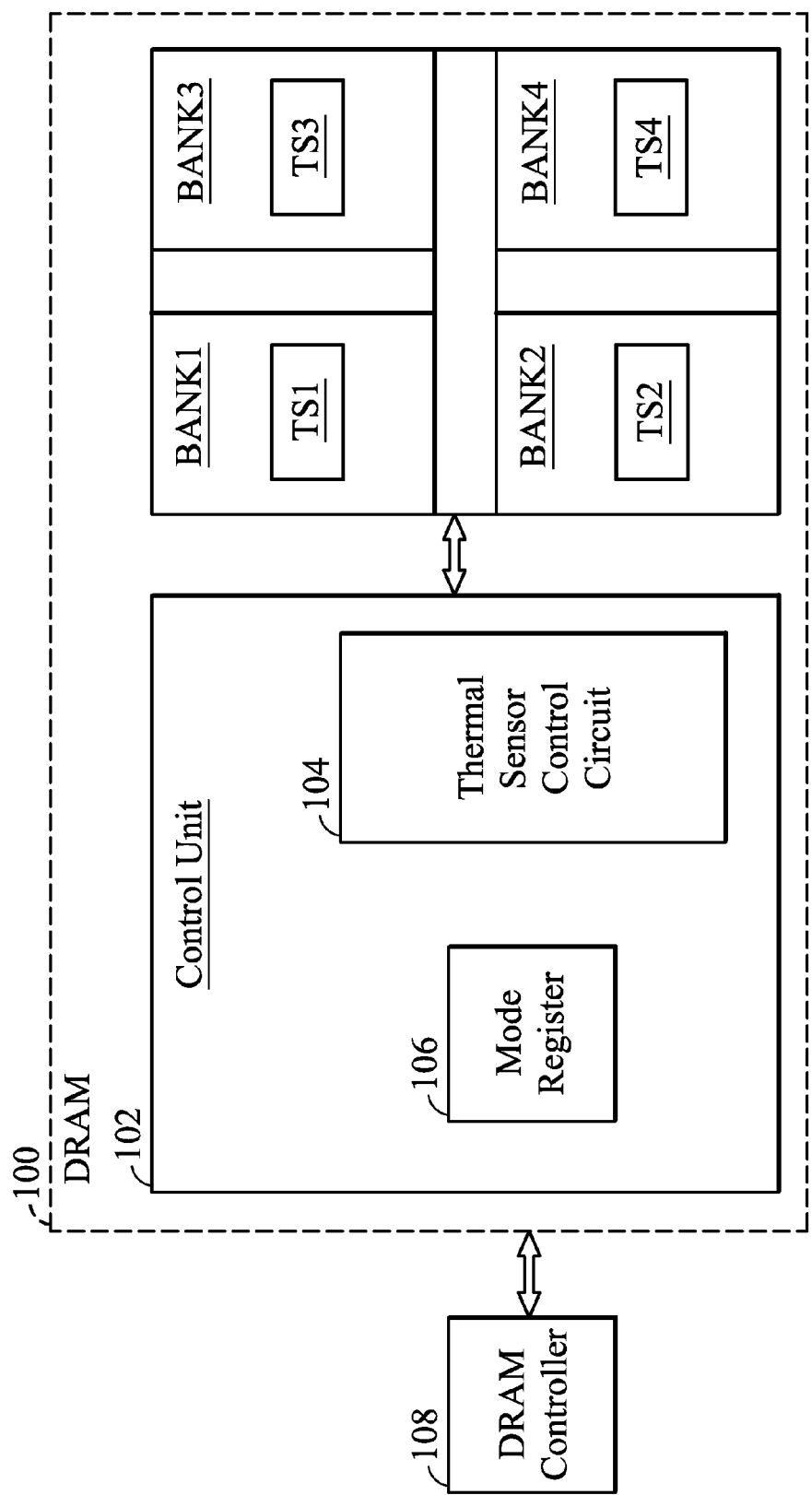
FIG. 1 depicts a dynamic random access memory (DRAM) 100 and a DRAM controller 108 in accordance with an exemplary embodiment of the invention.

FIG. 1 depicts a dynamic random access memory (DRAM) 100 and a DRAM controller 108 in accordance with an exemplary embodiment of the invention. The DRAM 100 comprises a plurality of banks BANK1 to BANK4, a plurality of thermal sensors TS1 to TS4 and a control unit 102. The thermal sensors TS1 to TS4 are disposed between the banks BANK1 to BANK4. The control unit 102 controls the thermal sensors TS1 to TS4 to sense temperature and thereby obtains sensed temperatures from the thermal sensors TS1 to TS4. Based on the highest one of the sensed temperatures, the control unit 102 sets a self-refresh cycle for all of the banks BANK1 to BANK4. The self-refresh cycle controls a self-refresh operation to be performed on the entire DRAM 100 (over bank BANK1 to bank BANK4) for data retention. In this manner, the memory retention is guaranteed because the worst current leakage problem due to the worst temperature condition has been taken into consideration.

Further, for data retention of partial arrays of the DRAM 100, a partial array self-refresh operation is introduced, wherein the control unit 102 sets partial array self-refresh cycles for unmasked banks of the banks BANK1 to BANK4 separately. For each unmasked bank, the partial array self-refresh cycle corresponding thereto is set according to the thermal condition thereof (obtained by the disclosed thermal sensors TS1 to TS4). In an exemplary embodiment, the control unit 102 further selects the unmasked bank at the lowest temperature compared to the other unmasked banks to store critical data. In this manner, critical data is stored in a robust bank.

In the embodiment shown in FIG. 1, the thermal sensor TS1 is surrounded by the storage cells of the bank BANK1, the thermal sensor TS2 is surrounded by the storage cells of the bank BANK2, the thermal sensor TS3 is surrounded by the storage cells of the bank BANK3, and the thermal sensor TS4 is surrounded by the storage cells of the bank BANK4. Note that the total number of the disclosed thermal sensors is not limited to the total number of the banks. For example, multiple thermal sensors may be disposed between the storage cells of one bank (uniformly, or depending on the design of the DRAM). In this case, the accuracy of thermal detection of an entire DRAM is considerably improved and the worst temperature condition can be precisely obtained and compensated for by the self-refresh operation.

The control unit 102 may further comprise a thermal sensor control circuit 104 and a mode register 106, and is coupled to the DRAM controller 108.

Figure 2:
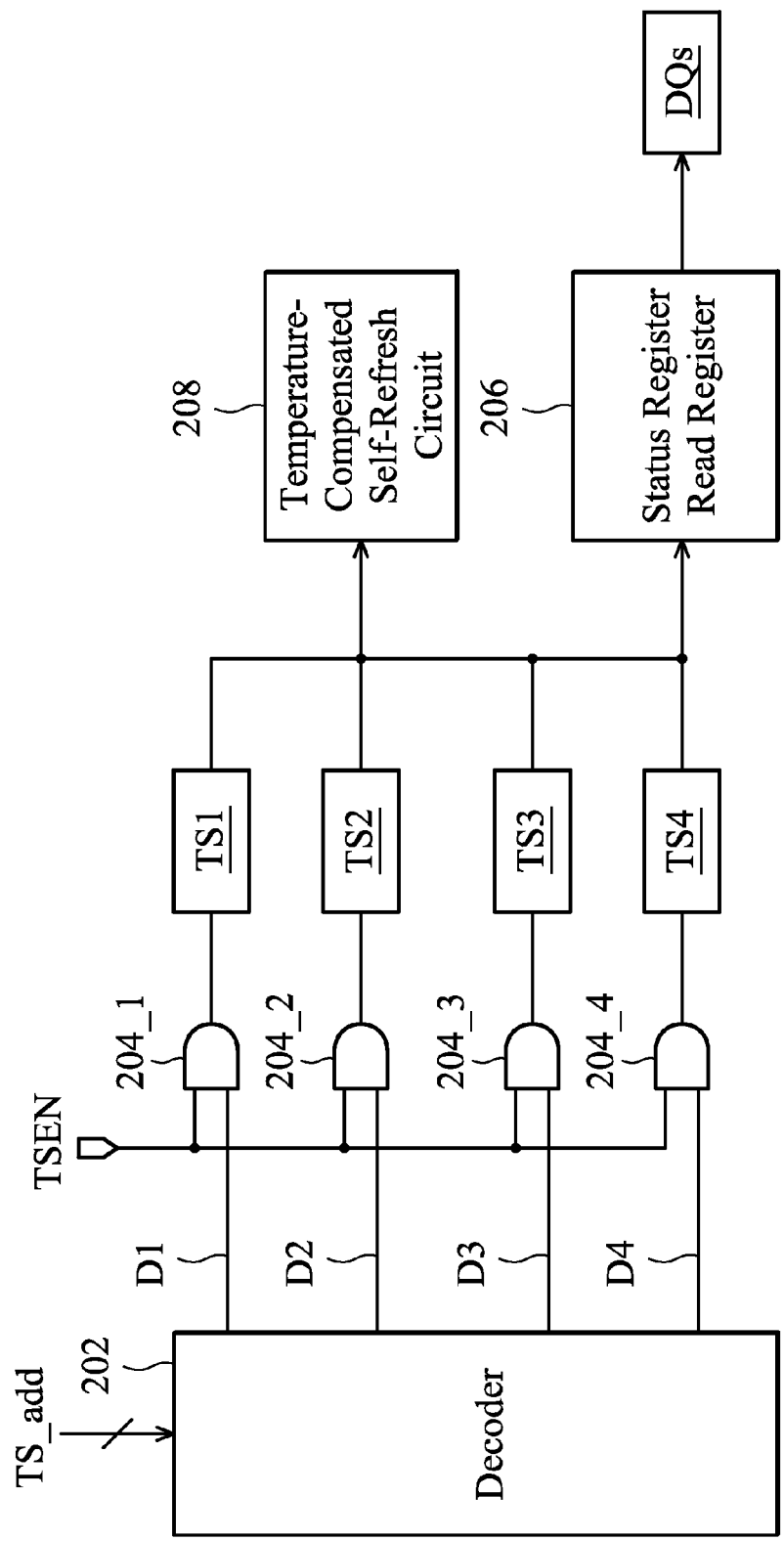
FIG. 2 depicts the thermal sensor control circuit 104 in accordance with an exemplary embodiment of the invention.

FIG. 2 depicts the thermal sensor control circuit 104 in accordance with an exemplary embodiment of the invention, which comprises a decoder 202, a plurality of AND gates 204_1 to 204_4, a status register read register (SRR register) 206 and data in/out lines DQs, and a temperature-compensated self-refresh circuit 208.

In the embodiment of FIG. 2, the thermal sensor to be enabled to sense temperature is indicated by a thermal sensor address TS_add. The decoder 202 decodes the thermal sensor address TS_add and thereby outputs decoded bits D1 to D4. Each of the AND gates 204_1 to 204_4 comprises a first input terminal, a second input terminal and an output terminal. The first input terminals of the AND gates 204_1 to 204_4 are all controlled by a thermal detection enable signal TSEN while the second input terminals of the AND gates 204_1 to 204_4 are controlled by the decoded bits D1 to D4, respectively. And the output terminals of the AND gates 204_1 to 204_4 are coupled to the plurality of thermal sensors TS1 to TS4, respectively, to enable the thermal sensor indicated by the thermal sensor address TS_add. In an exemplary embodiment, the thermal detection enable signal TSEN is activated at intervals. Considering power consumption, the thermal detection enable signal TSEN may be activated in quite a slow frequency in comparison with the data rate of the DRAM 100.

The SRR register 206 and the data in/out lines DQs coupled to the SRR register 206 are designed to transfer the sensed temperatures to the DRAM controller 108. The SRR register 206 is coupled to the thermal sensors TS1 to TS4, and the non-enabled thermal sensors have relatively high impedance to the enabled thermal sensor. In this manner, the SRR register 206 receives the sensed temperature of the enabled thermal sensor, and, via the data in/out lines DQs, the sensed temperature of the enabled thermal sensor is sent to the DRAM controller 108. In an exemplary embodiment, the thermal sensor address TS_add (output by the DRAM controller 108) may be transferred to the decoder 202 through the mode register 106. By changing the thermal sensor address TS_add, the sensed temperatures of the plurality of the thermal sensors TS1 to TS4 are collected by the DRAM controller 108.

Further, the temperature-compensated self-refresh circuit 208 is coupled to the thermal sensors TS1 to TS4 for performing the self-refresh operation or the partial array self-refresh operation.

Figure 3:
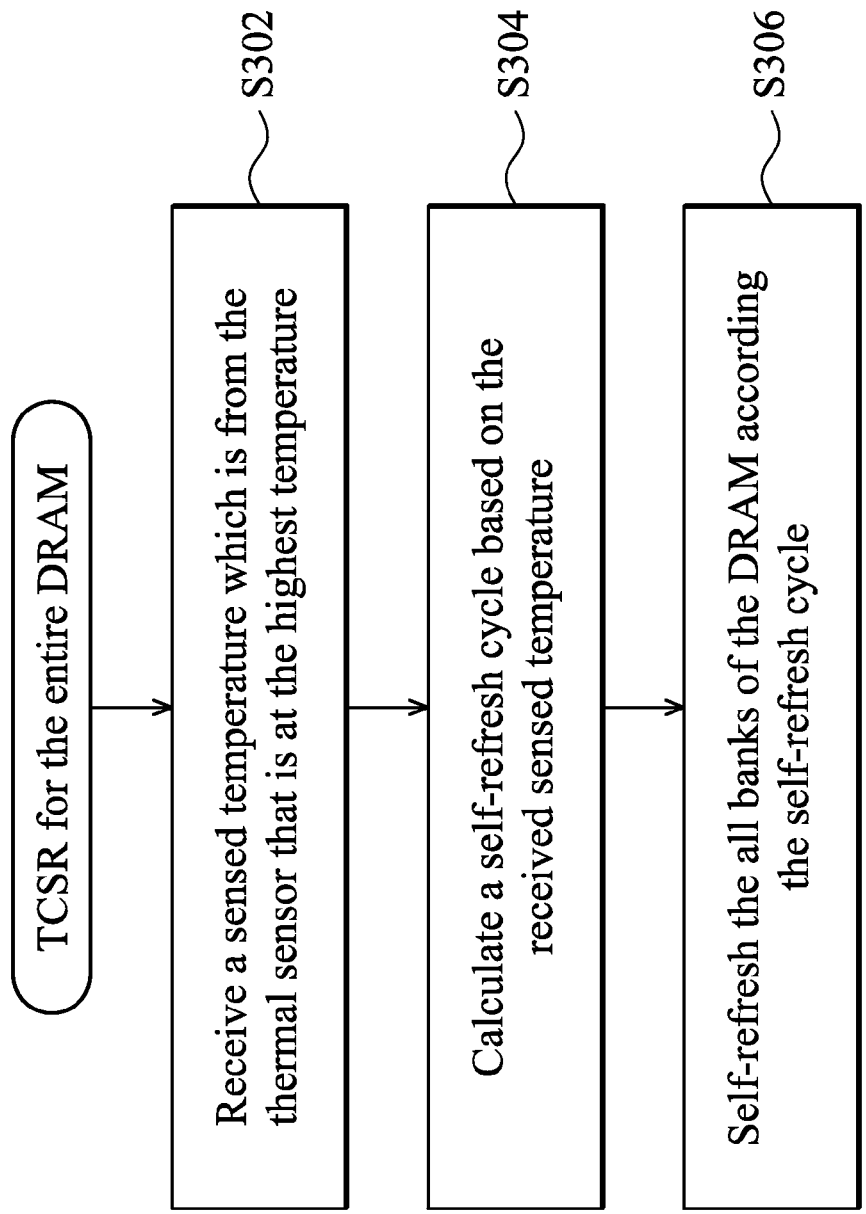
FIG. 3 is a flowchart shows how the temperature-compensated self-refresh circuit 208 processes the sensed temperature (from the thermal sensor that is at the highest temperature) and self-refreshes all of the banks of the DRAM 100 accordingly.

To operate the DRAM 100 in a self-refresh mode, the DRAM controller 108 compares the collected sensed temperatures and then reassigns the thermal sensor address TS_add via the mode register 106 to indicate the thermal sensor at the highest temperature and thereby obtain a sensed temperature (according to the reassigned thermal sensor address TS_add which indicates the thermal sensor at the highest temperature) for the temperature-compensated self-refresh circuit 208. FIG. 3 is a flowchart shows how the temperature-compensated self-refresh circuit 208 processes the sensed temperature (from the thermal sensor that is at the highest temperature) and self-refreshes the entire DRAM 100 accordingly. In step S302, the temperature-compensated self-refresh circuit 208 receives the sensed temperature (from the thermal sensor that is at the highest temperature). In step S304, the temperature-compensated self-refresh circuit 208 calculates the self-refresh cycle based on the received sensed temperature. In step S306, the temperature-compensated self-refresh circuit 208 self-refreshes all of the plurality of the banks BANK1 to BANK4 according the self-refresh cycle.

Figure 4:
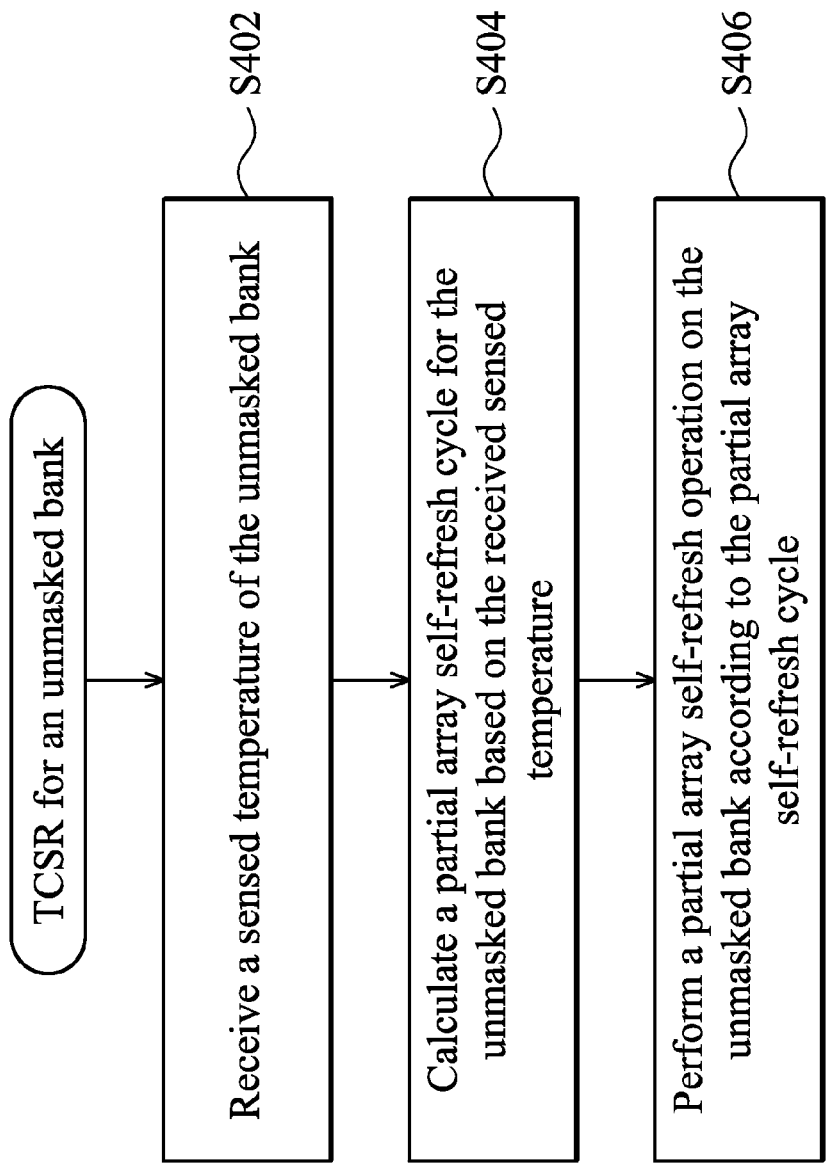
FIG. 4 is a flowchart shows how the temperature-compensated self-refresh circuit 208 processes the sensed temperature of the selected unmasked bank and performs a partial array self-refresh operation on the selected unmasked bank of the DRAM 100 accordingly.

To operate the DRAM 100 in a partial array self-refresh mode, the thermal sensor address TS_add provided by the DRAM controller 108 through the mode register 106 indicates the thermal sensor corresponding to a selected unmasked bank which is selected from unmasked banks of the DRAM 100. FIG. 4 is a flowchart shows how the temperature-compensated self-refresh circuit 208 processes the sensed temperature of the selected unmasked bank and performs a partial array self-refresh operation on the selected unmasked bank accordingly. In step S402, the temperature-compensated self-refresh circuit 208 receives the sensed temperature of the selected unmasked bank. In step S404, the temperature-compensated self-refresh circuit 208 calculates the partial array self-refresh cycle of the selected unmasked bank based on the received sensed temperature. In step S406, the temperature-compensated self-refresh circuit 208 performs a partial array self-refresh operation on the selected unmasked bank according to the partial array self-refresh cycle. The steps of FIG. 4 may be performed repeatedly on all unmasked banks of the DRAM 100.

In another exemplary embodiment, a DRAM control method is shown, wherein the DRAM comprises a plurality of thermal sensors disposed between banks of the DRAM (for example, referring to the banks BANK1 to BANK4 and the thermal sensors TS1 to TS4 of FIG. 1). According to the disclosed DRAM control method, the thermal sensors TS1 to TS4 are controlled to obtain sensed temperatures, and, a self-refresh cycle for all of the banks BANK1 to BANK4 is set based on the highest one of the sensed temperatures. In other embodiments, partial array self-refresh cycles for unmasked banks of the banks BANK1 to BANK4 are set separately according to the disclosed DRAM control method. Note that for each unmasked bank the partial array self-refresh cycle corresponding thereto is set according to the thermal condition thereof. In some embodiments, the unmasked bank at the lowest temperature compared to the other unmasked banks is utilized in storing critical data.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic random access memory with multi-zone temperature detection, comprising:
    a plurality of banks;
    a plurality of thermal sensors disposed between the plurality of banks; and
    a control unit, controlling the plurality of thermal sensors to obtain sensed temperatures, and setting a self-refresh cycle for all of the banks based on the highest one of the sensed temperatures.

2. The dynamic random access memory as claimed in claim 1, wherein the control unit further sets partial array self-refresh cycles for unmasked banks of the plurality of banks separately and, for each unmasked bank, the partial array self-refresh cycle corresponding thereto is set according to the thermal condition thereof.

3. The dynamic random access memory as claimed in claim 2, wherein the control unit further selects the unmasked bank at the lowest temperature compared to the other unmasked banks to store critical data.

4. The dynamic random access memory as claimed in claim 1, wherein the control unit comprises a thermal sensor control circuit which comprises:
    a decoder, decoding a thermal sensor address and thereby outputting decoded bits;
    a plurality of AND gates, wherein each of the plurality of AND gates comprises a first input terminal, a second input terminal and an output terminal, and the first input terminals of the AND gates are all controlled by a thermal detection enable signal while the second input terminals of the AND gates are controlled by the decoded bits, respectively, and the output terminals of the AND gates are coupled to the plurality of thermal sensors, respectively, to enable the thermal sensor indicated by the thermal sensor address.

5. The dynamic random access memory as claimed in claim 4, wherein the thermal sensor control circuit further comprises:
    a status register read register coupled to the plurality of the thermal sensors to receive the sensed temperature of the enabled thermal sensor; and
    data in/out lines coupled to the status register read register, wherein the thermal sensors which are not enabled have relatively high impedance to the enabled thermal sensor.

6. The dynamic random access memory as claimed in claim 5, wherein the control unit further comprises a mode register through which the thermal sensor address is provided to the decoder.

7. The dynamic random access memory as claimed in claim 6, wherein the control unit is further coupled to a DRAM controller which retrieves the status register read register via the data in/out lines to collect the sensed temperatures of the plurality of the thermal sensors.

8. The dynamic random access memory as claimed in claim 7, wherein the thermal sensor control circuit further comprises a temperature-compensated self-refresh circuit coupled to the plurality of thermal sensors and, to operate the dynamic random access memory in a self-refresh mode, the DRAM controller compares the collected sensed temperatures to obtain the thermal sensor at the highest temperature and reassigns the thermal sensor address through the mode register to indicate the thermal sensor at the highest temperature and thereby operates the decoder again.

9. The dynamic random access memory as claimed in claim 8, wherein when the dynamic random access memory is in the self-refresh mode the temperature-compensated self-refresh circuit receives the sensed temperature of the thermal sensor indicated by the reassigned thermal sensor address and calculates the self-refresh cycle based on the received sensed temperature and self-refreshes all of the plurality of the banks according the self-refresh cycle.

10. The dynamic random access memory as claimed in claim 6, wherein the mode register is further coupled to a DRAM controller which provides the decoder with the thermal sensor address via the mode register.

11. The dynamic random access memory as claimed in claim 10, wherein the thermal sensor control circuit further comprises a temperature-compensated self-refresh circuit coupled to the plurality of thermal sensors and, to operate the dynamic random access memory in a partial array self-refresh mode, the thermal sensor address provided by the DRAM controller indicates the thermal sensor corresponding to a selected unmasked bank selected from the unmasked banks.

12. The dynamic random access memory as claimed in claim 11, wherein when the dynamic random access memory is in the partial array self-refresh mode, the temperature-compensated self-refresh circuit receives the sensed temperature of the selected unmasked bank and calculates the partial array self-refresh cycle of the selected unmasked bank based on the received sensed temperature and performs a partial array self-refresh operation on the selected unmasked bank according to the partial array self-refresh cycle.

13. A method for controlling a dynamic random access memory having a plurality of thermal sensors disposed between banks of the dynamic random access memory, comprising:
  controlling the plurality of thermal sensors to obtain sensed temperatures, and
  setting a self-refresh cycle for all of the banks based on the highest one of the sensed temperatures.

14. The method as claimed in claim 13, further comprising:
  setting partial array self-refresh cycles for unmasked banks of the plurality of banks separately,
  wherein for each unmasked bank the partial array self-refresh cycle corresponding thereto is set according to the thermal condition thereof.

15. The method as claimed in claim 14, further comprising:
  using the unmasked bank at the lowest temperature compared to the other unmasked banks to store critical data.

* * * * *